(12) United States Patent
Minamitani et al.

(10) Patent No.: US 7,229,854 B2
(45) Date of Patent: Jun. 12, 2007

(54) ELECTRONIC COMPONENT MOUNTING METHOD AND APPARATUS AND ULTRASONIC BONDING HEAD

(75) Inventors: Shozo Minamitani, Ibaraki (JP); Takaharu Mae, Hirakata (JP); Yasuharu Ueno, Osaka (JP); Akira Yamada, Daito (JP); Shinji Kanayama, Kashihara (JP); Makoto Akita, Takatsuki (JP); Nobuhisa Watanabe, Suita (JP); Akira Mori, Toyonaka (JP); Hiroyuki Naito, Toyonaka (JP); Shinya Marumo, Higashiosaka (JP); Makoto Morikawa, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 283 days.

(21) Appl. No.: 10/508,460

(22) PCT Filed: Mar. 27, 2003

(86) PCT No.: PCT/JP03/03906

§ 371 (c)(1),
(2), (4) Date: Oct. 18, 2004

(87) PCT Pub. No.: WO03/081644

PCT Pub. Date: Oct. 2, 2003

(65) Prior Publication Data
US 2005/0227429 A1 Oct. 13, 2005

(30) Foreign Application Priority Data
Mar. 27, 2002 (JP) .......................... 2002-087594
Mar. 27, 2002 (JP) .......................... 2002-087595
Mar. 27, 2002 (JP) .......................... 2002-087596

(51) Int. Cl.
*H01L 21/50* (2006.01)

(52) U.S. Cl. .............................. 438/120; 257/E21.518

(58) Field of Classification Search ................ 438/120; 257/E21.518
See application file for complete search history.

(56) References Cited

U.S. PATENT DOCUMENTS 6,193,136 B1   2/2001   Higashi et al.
6,406,990 B1 *  6/2002   Kawai .......................... 438/612

(Continued)

FOREIGN PATENT DOCUMENTS

JP   2000-68327   3/2000

*Primary Examiner*—Scott B. Geyer
(74) *Attorney, Agent, or Firm*—Jordan and Hamburg LLP

(57) ABSTRACT

A component mounting apparatus includes a component feeder (20) that feeds a component (2) with its bump electrodes facing down, a mounting head (5) that mounts the component onto a substrate (3), a supporting base (8) that secures the substrate, and a positioning device (6, 7) that aligns the component with the substrate. The mounting head includes an ultrasonic vibration generator (24), an ultrasonic vibration propagation member (34, 38, 54) that conveys the ultrasonic vibration provided by the ultrasonic vibration generator to a working face (33, 41, 57) holding the component as vibration parallel thereto, a pressure loader (22, 23, 39, 55, 59) that applies a pressure load to the working face from a position immediately thereabove in the direction perpendicular thereto, and a heater (32, 47, 49, 50, 51, 52, 53) that heats the vicinity of the working face. Thereby, ultrasonic bonding is carried out with high reliability even if the component has a number of bump electrodes (2*a*) on its face.

7 Claims, 17 Drawing Sheets

U.S. PATENT DOCUMENTS

| | | | |
|---|---|---|---|
| 6,437,450 B1 * | 8/2002 | Baba et al. | 257/778 |
| 6,460,591 B1 * | 10/2002 | Gotoh et al. | 156/359 |
| 6,564,988 B1 * | 5/2003 | Shiraishi et al. | 228/110.1 |
| 6,565,687 B2 * | 5/2003 | Gotoh et al. | 156/64 |
| 6,653,171 B2 * | 11/2003 | Ikegami | 438/120 |
| 6,664,645 B2 * | 12/2003 | Kawai | 257/778 |
| 6,718,604 B1 * | 4/2004 | Taga et al. | 29/25.35 |
| 2001/0051396 A1 | 12/2001 | Iwahashi et al. | |
| 2002/0031903 A1 | 3/2002 | Yasutake et al. | |

* cited by examiner

ELECTRONIC COMPONENT MOUNTING METHOD AND APPARATUS AND ULTRASONIC BONDING HEAD

TECHNICAL FIELD

The present invention relates to a method and apparatus for mounting components, such as an electronic component having a plurality of bump electrodes on its surface, onto a mounting object such as a substrate by applying ultrasonic vibration, as well as to an ultrasonic bonding head used for bonding various components.

BACKGROUND ART

As disclosed in Japanese Patent Laid-Open Publication No. 2000-68327 for example, a conventional component mounting apparatus utilizing ultrasonic vibration typically includes a mounting head equipped with a horn and a suction nozzle, means for feeding an electronic component to the mounting head, a supporting base that holds the mounting object, and a positioning device that relatively moves the mounting head against the supporting base in the horizontal direction to put the electronic component in the right place on the mounting object. The horn is coupled with the output of an ultrasonic vibration generator horizontally fixed to a supporting bracket that is vertically movably supported by a moving mechanism such as a voice coil motor, while the suction nozzle that holds the electronic component is installed at the end of the horn.

Component mounting apparatuses of this type are suitably employed when a plurality of bump electrodes formed on a face of the electronic component are ultrasonically bonded onto leads formed on the mounting object. The suction nozzle holds the top face of an electronic component that has been fed with its bump electrodes facing down, while the supporting base secures the mounting object thereon. The electronic component is put in the right place on the mounting object by relatively moving the mounting head against the supporting base, and then the bump electrodes of the electronic component are contacted with the leads of the mounting object. With a predetermined pressure load applied on the component, the suction nozzle is vibrated in the horizontal direction via the horn with ultrasonic vibration generated by the ultrasonic vibration generator. The ultrasonic vibration energy is provided to the contact face between the electronic component and the mounting object, and they are bonded by diffusion and melting.

In these years, however, there is a need for reducing the number of electronic components (chips) to downsize electronic circuits, and the functions and density of electronic components have been much improved. As a result, individual electronic components have become larger and come to have more electrodes than ever. For example, electronic components (bare IC chips) were about 0.3 to 5 mm per side and had about 2 to 30 bump electrodes. However, they are expected to be 10–20 mm per side and have 50–100 or even 1000 or more bump electrodes in the near future.

When such an electronic component is mounted on a circuit with a conventional component mounting apparatus, the pressure load applied to the suction nozzle must be large to bond many bump electrodes at a time to the leads of the mounting object by ultrasonic vibration. In addition, the bottom face of the suction nozzle holding the component must be aligned precisely parallel to the bonding face of the mounting object to ensure bonding between all the bump electrodes and the leads of the mounting object. For instance, when mounting such a large bare IC chip, the component holding face of the suction nozzle must be maintained parallel to the bonding face of the mounting object over the entire area within a tolerance of 5 µm in the direction of ultrasonic vibration.

However, in the above configuration, if a large pressure load is applied by the supporting bracket to the vicinity of the junction between the ultrasonic vibration generator and the horn, since the suction nozzle is fastened to the end of the horn, and thus, the bottom face of the suction nozzle is distant from the position receiving such pressure load, a bending moment works on the horn. Then a deformation of the horn due to the pressure load makes the component holding face slant, and a precise parallelism cannot be obtained. Meanwhile, there is an idea to insert an elastic unit between the horn and the component holding face of the suction nozzle for ensuring parallelism therebetween. This, in turn, significantly lowers the ultrasonic vibration propagation efficiency. Then bonding efficiency becomes lower, and reliable bonding cannot be provided.

When the chip has many bump electrodes, the bonding energy provided by ultrasonic vibration is likely to be short, even if the parallelism between the component holding face and the bonding face of the mounting object is maintained and a large pressure load is applied along with ultrasonic vibration. Then it becomes difficult to carry out bonding with high reliability.

There has been another problem that the process cost becomes high because extra steps are needed to fill a seal material in between the chip and the mounting object after bonding and then to thermo-cure the seal material.

On the other hand, there is an ultrasonic bonding head where one end of an oscillator working as the horn is coupled with the output of the ultrasonic vibration generator while the other end has a working face disposed parallel to the bonding face.

According to this method, however, the pressure load must be large to ensure bonding if the bonding area is large or the total bonding area of multiple bump electrodes is large. At the same time, the parallelism between the working face of such a working unit and the bonding face of the mounting object must be kept excellent to ensure bonding over the entire bonding area.

In fact, however, excellent parallelism cannot be provided because a bending moment works on the oscillator when a large pressure load is applied thereto and because the working face slants due to the bend of the oscillator. Particularly when a plurality of bump electrodes are arranged over a wide bonding face, it is difficult to ensure parallelism. Otherwise, if ultrasonic vibration is provided under a pressure load that does not cause such a slanting problem in the working face, the bonding energy of ultrasonic vibration may not be high enough to provide a reliable bonding condition.

An object of the present invention is to provide a component mounting method and apparatus, and an ultrasonic bonding head that ultrasonically bonds components with high reliability even when the component has many bump electrodes, and thus, the bonding area between the component and the mounting object is large.

DISCLOSURE OF THE INVENTION

A component mounting method according to a first aspect of the invention is a method for mounting a component having a plurality of bump electrodes on its face onto leads of a mounting object. This method includes a step of holding a rear face of the component opposite to the face having the bump electrodes, aligning the component with the mounting object disposed on a supporting base, and contacting the individual bump electrodes of the component to the individual leads of the mounting object, and a step of applying a pressure load to the rear face of the component from a position immediately thereabove in a direction perpendicular thereto while providing ultrasonic vibration of which vibrating direction is substantially parallel thereto.

Since a pressure load is applied normal to the rear face of the electronic component, the parallelism between the ends of the plurality of bump electrodes of the component and the bonding face of the mounting object is maintained with high precision even if a large pressure load is applied. Since a large pressure load is allowed, ultrasonic vibration is provided with a predetermined pressure load being applied uniformly onto the individual bump electrodes, even if the electronic component has many bump electrodes. Then all the bump electrodes are bonded with high reliability.

A component mounting method according to a second aspect of the invention is a method including a step of holding a rear face of the component opposite to the face having the bump electrodes, aligning the component with the mounting object disposed on a supporting base, and contacting the individual bump electrodes of the component to the individual leads of the mounting object, and a step of applying a pressure load to the rear face of the component while providing ultrasonic vibration of which vibrating direction is substantially parallel thereto and providing thermal energy to a bonding area between the component and the mounting object.

Even if the electronic component has many bump electrodes, all the bump electrodes are bonded with high reliability. In this configuration, since a seal material is applied to the bonding place of the mounting object in advance, the seal material is filled in between the electronic component and the mounting object in the step of providing ultrasonic vibration, and the seal material is cured by the thermal energy. Thus, there is no need of a separate sealing process.

A component mounting method according to a third aspect of the invention is a method including a step of holding a component with a working face of an oscillator that is configured such that vibration provided to an end face thereof causes vibration substantially parallel to the working face and that a node of an oscillation mode is formed on an axis perpendicular to the working face, a step of disposing a mounting object on a supporting base, a step of aligning the component with the mounting object and contacting the component to the mounting object, and a step of applying a pressure load from the node of the oscillator while providing ultrasonic vibration from the one end face of the oscillator.

In this configuration, when the ultrasonic vibration is provided from one end of the oscillator, the working face ultrasonically vibrates approximately in parallel thereto, and a pressure load works normal thereto. Since a large ultrasonic energy can be applied under the large pressure load, while maintaining a precise parallelism between the working face and the bonding face, the entire bonding face is bonded with high reliability even if the bonding area is large.

A component mounting apparatus according to a fourth aspect of the invention is an apparatus for mounting a component having a plurality of bump electrodes on its face onto leads of a mounting object. This mounting apparatus includes a component feeder for feeding the component with its bump electrodes facing down, a mounting head for holding the component and mounting it onto the mounting object, a supporting base for securing the mounting object, and a positioning device for relatively moving the mounting head against the supporting base to align the component with the mounting object. This mounting head includes an ultrasonic vibration generator, an ultrasonic vibration propagation member for conveying ultrasonic vibration provided by the ultrasonic vibration generator to a working face holding the component as vibration parallel thereto, and a pressure loader for applying a pressure load to the working face of the propagation member from a position immediately thereabove in a direction perpendicular thereto.

According to this configuration, the ultrasonic vibration is provided while applying a predetermined pressure load onto the bump electrodes uniformly, even if the electronic component has many bump electrodes. Then all the bump electrodes are bonded with high reliability.

A component mounting apparatus according to a fifth aspect of the invention includes a component feeder for feeding a component with its bump electrodes facing down, a mounting head for holding the component and mounting it onto a mounting object, a supporting base for securing the mounting object, and a positioning device for relatively moving the mounting head against the supporting base to align the component with the mounting object. This mounting head includes an ultrasonic vibration generator, an ultrasonic vibration propagation member for conveying ultrasonic vibration provided by the ultrasonic vibration generator to a working face holding the component as vibration parallel thereto, a pressure loader for applying a pressure load to the working face of the propagation member, and a heater for heating a vicinity of the working face.

According to this configuration, all the bump electrodes are bonded with high reliability, even if the electronic component has many bump electrodes.

A component mounting apparatus according to a sixth aspect of the invention includes a component feeder, a mounting head for holding a fed component and mounting it onto a mounting object, a supporting base for fastening the mounting object, and a positioning device for relatively moving the mounting head against the supporting base to align the component with the mounting object. This mounting head includes an ultrasonic vibration generator, an oscillator of which one end face is connected to the ultrasonic vibration generator and the other end face works as a working face, the oscillator being configured such that vibration provided to the end face causes vibration in the working face in a direction substantially parallel thereto and that a node of an oscillation mode is formed on an axis perpendicular to the face, and a pressure loader for applying a pressure load to the node of the oscillator.

An ultrasonic bonding head according to a seventh aspect of the invention includes an ultrasonic vibration generator, an oscillator of which one end face is connected to the ultrasonic vibration generator and the other end face works as a working face, and a heater for heating a vicinity of the working face.

According to this configuration, an ultrasonic vibration energy is given to the bonding face from the working face, with ultrasonic vibration being provided from one end of the oscillator, while a pressure load is applied to the extent that the working face of the oscillator does not slant, and at the same time the working face is heated by a heater. A large ultrasonic vibration energy and thermal energy are provided at a time, and the entire bonding face is bonded with high reliability, even if the bonding area is large. A non-contact, indirect heater is particularly preferable, because it heats the working face and its vicinity without affecting the oscillation mode of the oscillator.

BEST MODE FOR CARRYING OUT THE INVENTION

Now embodiments of the component mounting method, component mounting apparatus, and ultrasonic bonding head used therein will be described below with reference to the accompanying drawings.

(First Embodiment)

Figure 1:
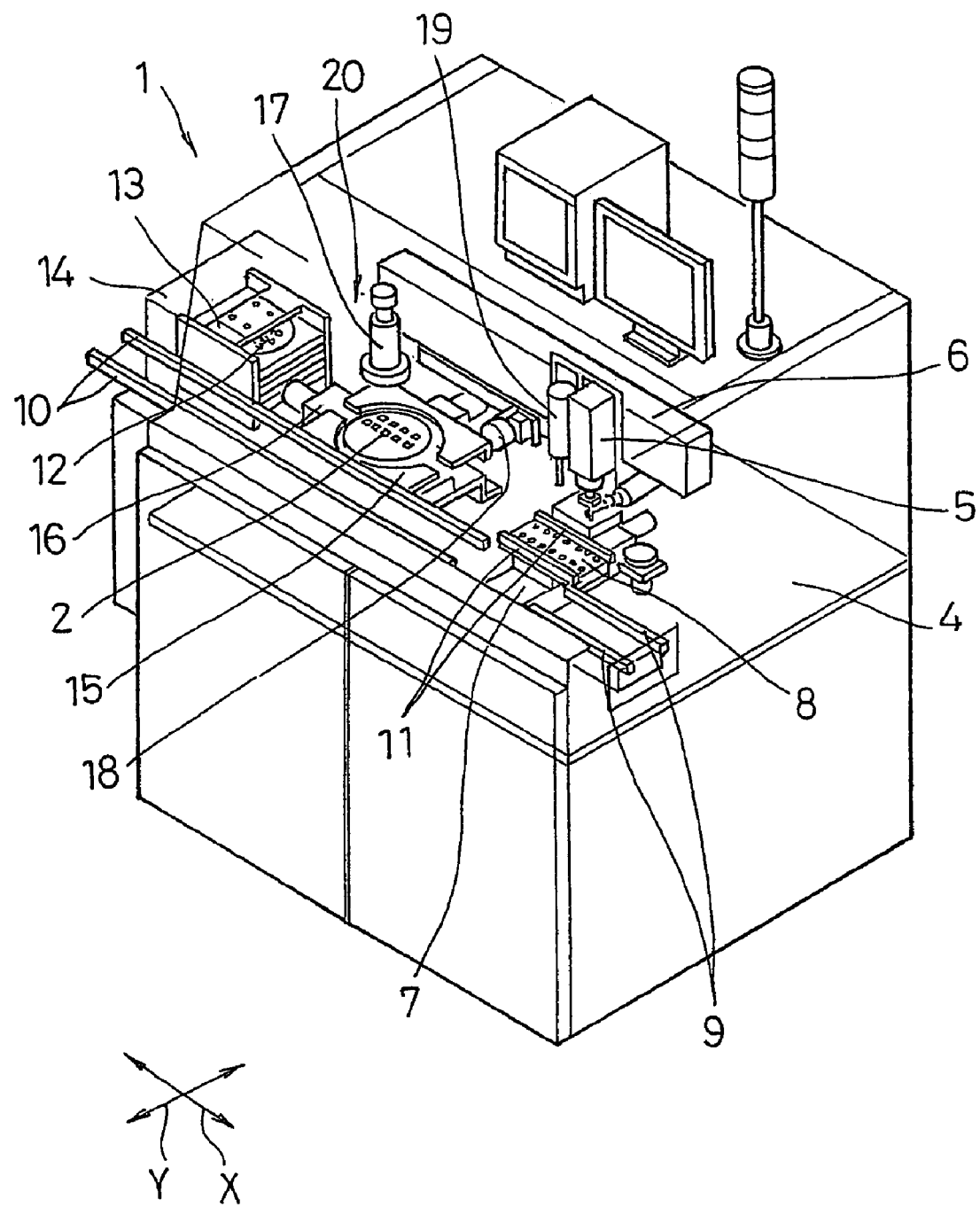
FIG. 1 is a perspective view showing the schematic structure of a component mounting apparatus according to a first embodiment of the present invention.

The component mounting method and apparatus according to a first embodiment are described with reference to FIGS. 1–3.

First, the overall structure of the component mounting apparatus is described with reference to FIGS. 1–2. The component mounting apparatus 1 mounts a component 2 (bare IC chip) onto a substrate 3 (mounting object, see FIG. 3). The component 2 has a plurality of bump electrodes 2a arranged on one face thereof. The component mounting place in the substrate 3 has leads which will be bonded with the bump electrodes 2a. The component 2 is, for example, 10–20 mm per side, and has 50–100 or more bump electrodes 2a. A particularly large component 2 may have 1000 or more bump electrodes.

In a rearward position of the base 4 of the component mounting apparatus 1, installed is an X-direction table 6 holding a mounting head 5 movable in an X direction. The mounting head 5 holds the component 2 and mounts it onto the substrate 3. A Y-direction table 7 is installed movably in a Y direction between a specific part under the X-direction table 6 and a frontward position of the table 6, while the Y-direction table 7 has a supporting base 8 on which the substrate 3 is mounted. In front of the X-direction table 6, installed is a loader 9 that carries the substrate 3 from one end of the base 4 to the Y-direction table 7, and an unloader 10 that carries the substrate 3 from the Y-direction table 7 to the other end of the base 4. The loader 9 and the unloader 10 each have a pair of rails that support both sides of the substrate 3. The supporting base 8, having transport rails 11 on its front and rear sides that can be connected to the above pair of rails and move vertically, receives the substrate 3 onto the transport rails 11 and then fixes it on the supporting base 8.

In a frontward position of the X-direction table 6 on the side of the unloader 10 on the base 4, such a component magazine 13 is disposed that houses semiconductor wafers 12 where a number of components 2 have been formed and diced on an expand sheet. A magazine lifter 14 is installed to lift a desired semiconductor wafer 12 to a prescribed height, and an expand table 15 is disposed between the magazine lifter 14 and the Y-direction table 7. The expand table 15 arranges the components 2 with spacings, expanding the expand sheet for each semiconductor wafer 12 delivered by the magazine lifter 14. The expand table 15 is installed on an X-Y table 16 that positions a component 2 in a first component supply position. A recognition camera 17 recognizes the component 2 placed on the first component supply position.

A component flipper 18 catches the component 2 in the first component supply position, transports the component 2 to a second component supply position, using another X-direction table, and turns the component 2 by 180 degrees to face up. In a semiconductor wafer 12, the bump electrodes 2a of a component 2 are formed on its top face. When the top face where the bump electrodes 2a are formed is caught by the component flipper 18 and then turned over 180 degrees, the top face of the component 2 where the bump electrodes 2a are formed faces down, and the component 2 is received by the mounting head 5 in the second component supply position. Such a magazine lifter 14, expand table 15 and component flipper 18 constitute a component feeder 20 that feeds a component 2 to the mounting head 5. A dispenser 19 applies a seal material to the component 2 or to the portion of the substrate 3 where the component 2 will be mounted.

Figure 2:
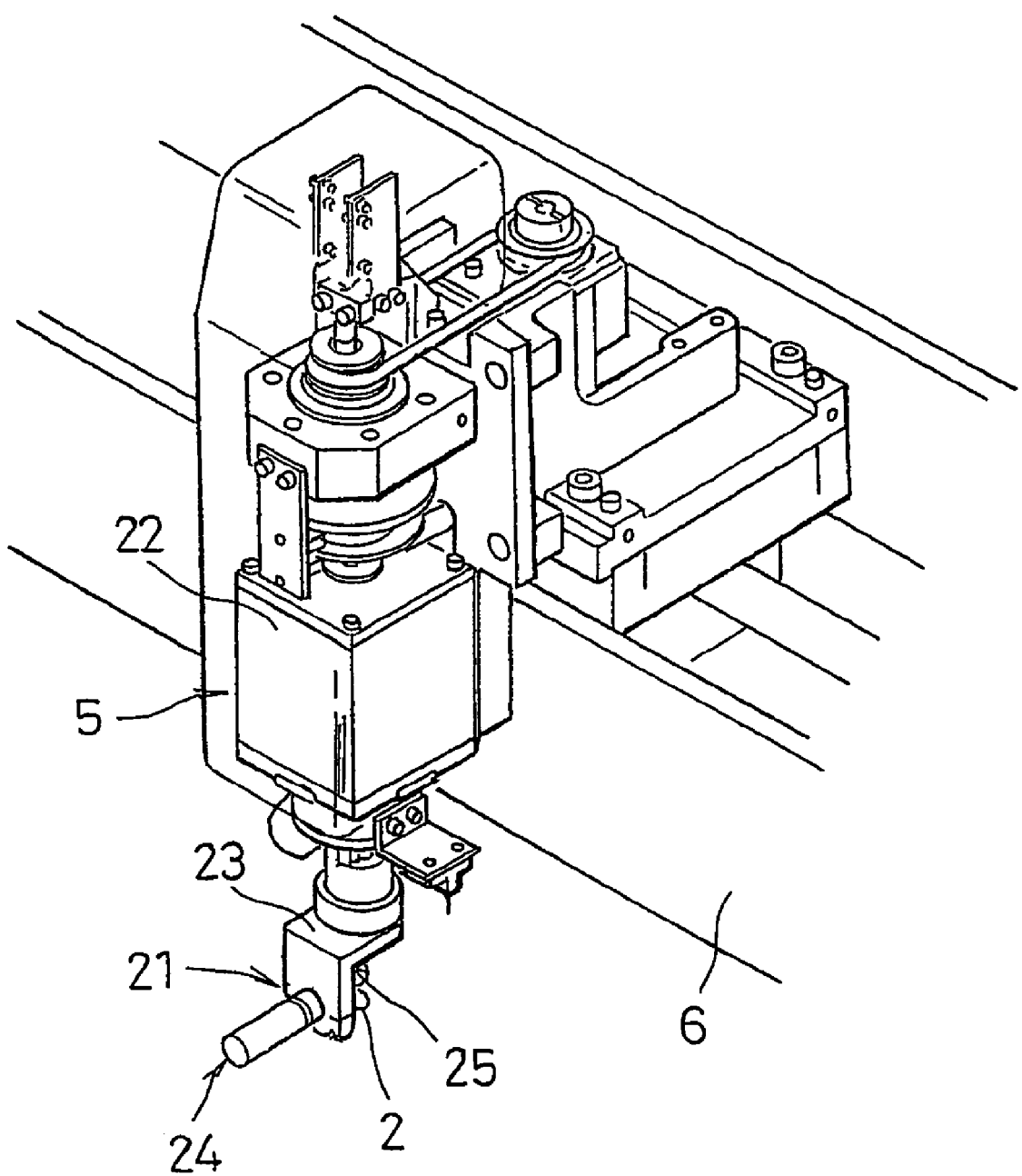
FIG. 2 is a perspective view showing a mounting head of the component mounting apparatus.
Figure 3:
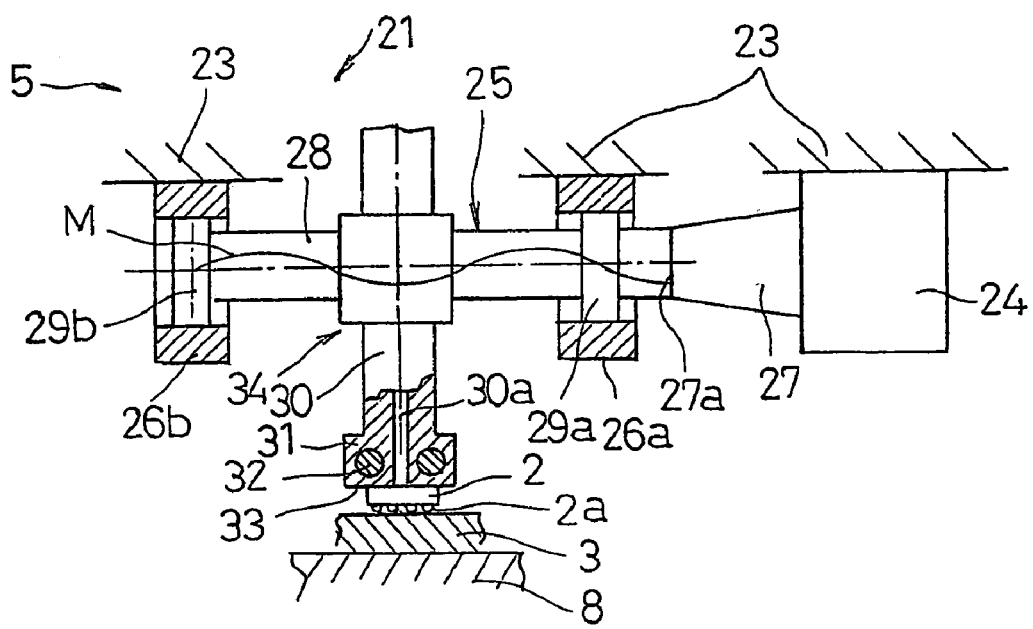
FIG. 3 is a sectional front view showing the essential part of the mounting head according to the embodiment.

Referring now to FIG. 2, the mounting head 5 has an ultrasonic bonding head 21 at the bottom end of a spline shaft (not shown) that is moved vertically in the axial direction by a moving device 22 such as a voice coil motor. The ultrasonic bonding head 21 is formed by an ultrasonic vibration generator 24 and an oscillator 25 which are secured to a supporting bracket 23. The oscillator 25 or the suction nozzle holds the component 2.

Now the mounting operation of such a component mounting apparatus is described below. After the component feeder 20 supplies a component 2 with its bump electrodes 2a facing down to the second component supply position, the oscillator 25 of the mounting head 5 or the suction nozzle fixed thereon holds the component 2, and the mounting head 5 moves in the X-direction to a position on the substrate 3 where the component 2 will be mounted, using the X-direction table 6. On the other hand, after the substrate 3 delivered by the loader 9 is moved onto the transport rails 11 attached to the Y-direction table 7, the transport rails 11 come down to a prescribed height and the substrate 3 is mounted on the supporting base 8. Next, the Y-direction table 7 moves in the Y direction until the substrate 3 is seated in the right place corresponding to the component 2 under the mounting head 5. Next, after the dispenser 19 has applied a seal material as required, the moving device 22 of the mounting head 5 lowers the component 2 so that its bump electrodes 2a contact leads of the substrate 3 positioned in the mounting place. The ultrasonic vibration generator 24 is activated, while the moving device 22 applies a predetermined pressure load, and the ultrasonic vibration energy is provided to the bonding face between the bump electrodes 2a and the leads of the substrate 3 for bonding by diffusion and fusion. The seal material applied by the dispenser 19 is filled in the space between the substrate 3 and the component 2, and then the mounting of the component 2 onto the substrate 3 is completed. When the mounting of the component 2 has been completed, the transport rails 11 come up and the substrate 3 is received onto the transport rails 11, and the substrate 3 is moved away by the unloader 10 when the transport rails 11 are connected to the unloader 10.

Next, the structure of the ultrasonic bonding head 21, which is the essential part of the mounting head 5, will be described with reference to FIG. 3. To the supporting bracket 23, a pair of supporting blocks 26a, 26b that hold the oscillator 25 are installed with their axes being aligned horizontal, and the output end 27a of a horn 27 that amplifies the vibration amplitude is coupled concentrically with one end of the oscillator 25, while the ultrasonic vibration generator 24 is connected to the other end of the horn 27. The oscillator 25 has a shaft 28 which is $(1+3/4)\lambda$ long, where $\lambda$ is the wavelength of oscillation mode M. Supporting units 29a, 29b are located at $\lambda/4$ from one end and at the other end, respectively, which correspond nodes of the vibration mode, being supported by the supporting blocks 26a, 26b. A suction nozzle 30 is installed so as to penetrate the shaft 28 perpendicularly in the position corresponding to an anti-node of the vibration mode in the center between the supporting units 29a, 29b. Reference alphanumeral 30a denotes a suction pathway formed in the shaft of the suction nozzle 30. At the bottom of the suction nozzle 30, a working unit 31 of a size corresponding to the component 2 to be held is formed, with a heater 32 such as a cartridge heater being buried in the working unit 31, and its bottom face works as a working face 33 that holds the component 2. The shaft 28 of the oscillator 25 and the suction nozzle 30 constitute an ultrasonic propagation member 34 that conveys ultrasonic vibration generated by the ultrasonic vibration generator 24 to the working face 33.

The mounting head 5 has an adjustment mechanism (not shown) that holds the parallelism between the working face 33 and the top face of the supporting base 8 at 5 μm or less. Ultrasonic vibration generated by the ultrasonic vibration generator 24 and then conveyed to the working face 33 via the ultrasonic propagation member 34 is controlled in the working face 33 so that its vertical element is less than 3% of the lateral element parallel thereto. The pressure load applied onto the working face 33 by the moving device 22 such as a voice coil motor and a cylinder is adjusted in accordance with the diameter of each bump electrode 2a of the component 2 and their number. Although it varies with the diameter of each bump electrode 2a, assuming typically 30–50 g per bump electrode 2a, a pressure load that is a product of this unit load per bump electrode 2a and the number of bump electrodes is applied. Otherwise, the unit load per bump electrode 2a may be assumed to be 30–200 g when calculating the pressure load.

In the above configuration, with the substrate 3 being mounted on the supporting base 8 and the component 2 being held by the working face 33 of the ultrasonic bonding head 21, the moving device 22 lowers the suction nozzle 30 toward the supporting base 8, and sandwiches the substrate 3 and the component 2 between the working face 33 and the top face of the supporting base 8. In this state, a prescribed pressure load is applied onto the working face 33 via the supporting brackets 23, the pair of supporting blocks 26a, 26b and the shaft 28 constituting the oscillator 25 as well as the suction nozzle 30. At this time, the pressure load is applied downwardly normal to the working face 33 along its vertical axial line. Under this condition, the ultrasonic vibration generator 24 provides ultrasonic vibration, and the heater 32 is activated for heating.

Because a pressure load is vertically applied from a directly upward position onto the rear face of the component 2, the ends of the plurality of bump electrodes 2a of the component 2 are held precisely parallel to the bonding face of the substrate 3, even when a large pressure load is applied. Thus, even if the component 2 has many bump electrodes 2a and the applied pressure load is large, ultrasonic vibration is provided to the bump electrodes 2a, with a prescribed pressure load being applied thereto uniformly. All the bump electrodes 2a are thereby bonded with high reliability.

Furthermore, by providing thermal energy to the component 2 from its rear face with the heater 32, while providing ultrasonic energy to between the bump electrodes 2a and the leads of the substrate 3, all the bump electrodes 2a are bonded efficiently even if the component 2 has many bump electrodes 2a and the bonding area is large. Note that heating may be continued across before and after bonding.

In such a case, another heater (not shown) may be installed on the side of the supporting base 8 to provide thermal energy from the substrate 3 side as well. Such a heater on the side of the supporting base 8 is not essential. Alternatively, a heater may be installed only on the side of the supporting base 8 to provide thermal energy.

The seal material, which has been applied to the mounting place on the substrate 3 by the dispenser 19 and filled in between the component 2 and the substrate 3 upon mounting of the component 2, is heated to cure during the above heating process, and then the sealing is completed along with bonding of the component 2 at a time. As a result, no subsequent sealing process becomes necessary, and therefore manufacturing cost is reduced.

As described before, since the vertical element of ultrasonic vibration is controlled to be less than 3% of the lateral element parallel to the working face 33, damage to the bump electrodes 2a and their serious deformation are prevented during the ultrasonic bonding under a large pressure load. Thus, an appropriate bonding condition is provided. If the vertical element of ultrasonic vibration energy is less than 10% (preferably less than 5%) of the lateral element, bonding is performed appropriately even when the number of bump electrodes 2a is rather large. Instead, the vertical element becomes 10% or more, there is a concern that the bump electrodes 2a may deform significantly if a large pressure load is applied.

In such a component 2 that has 50 or more bump electrodes 2a on its face, if a unit load onto each bump electrode 2a is controlled to be 30–50 g and the product of this unit load and the number of bump electrodes 2a is applied as the pressure load, no excess load works on each bump electrode 2a and bump electrodes 2a do not deform.

(Second Embodiment)

Figure 4:
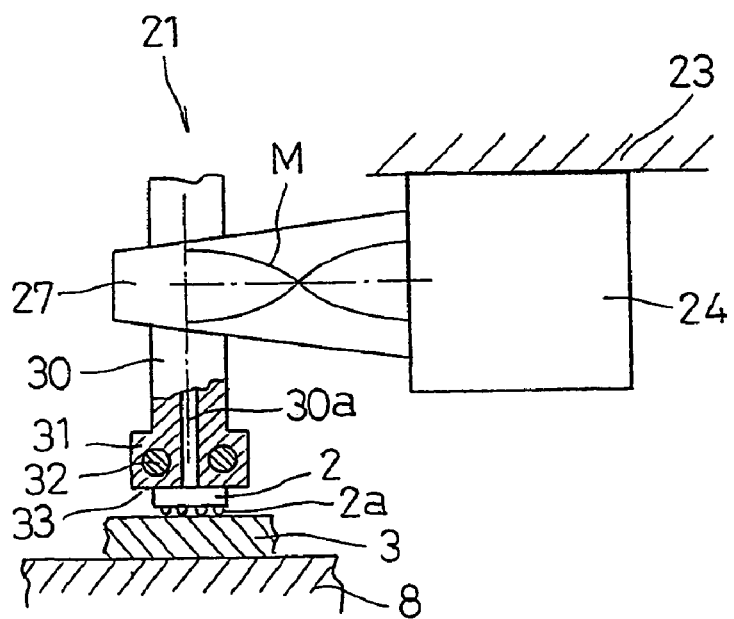
FIG. 4 is a sectional front view showing the essential part of a mounting head according to a second embodiment.

Now a second embodiment of the component mounting apparatus of the invention will be described with reference to FIG. 4. In the following embodiments, the same members as those used in the preceding embodiment have the same numerals throughout the figures, and their description is omitted. Instead, only differences will be described below.

In the present embodiment, the ultrasonic vibration generator 24 has a horn 27 of a relatively large rigidity, and a suction nozzle 30 is vertically installed through the position $\lambda/2$ away from the input end face of the horn 27.

Under such configuration, the ultrasonic energy to be provided and the pressure load are reduced by providing thermal energy from the heater 32 embedded in the working unit 31. Then, the parallelism between the working face 33 and the supporting base 8 is held within a prescribed range, while a pressure load being applied, and the vertical element of the ultrasonic vibration energy is limited to less than 10% of the lateral element in the working face 33. As a result, all the bump electrodes 2a are bonded precisely.

(Third Embodiment)

Now a third embodiment of the component mounting apparatus of the invention will be described with reference to FIGS. 5–12.

Figure 5:
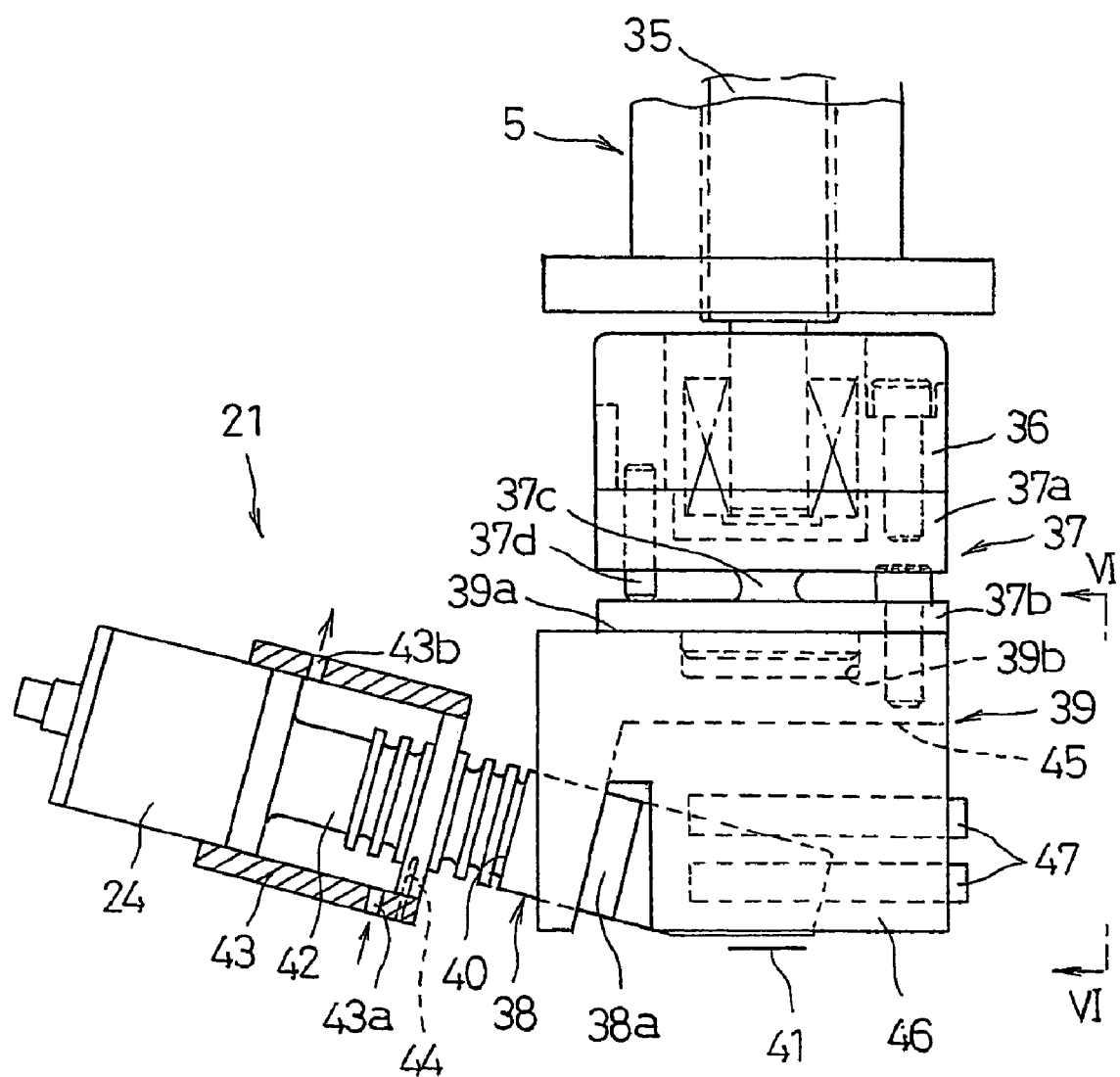
FIG. 5 is a sectional front view showing the essential part of a mounting head according to a third embodiment.
Figure 6:
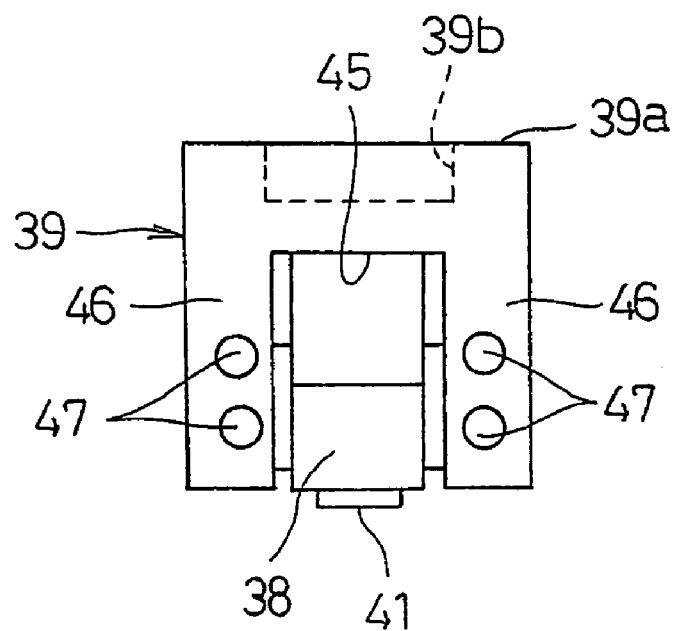
FIG. 6 is a sectional view taken along the line VI—VI in FIG. 5.

Referring to FIGS. 5 and 6, the ultrasonic bonding head 21 is attached to the bottom end of the spline shaft 35 via a fixing unit 36 and a parallelism adjusting mechanism 37, the spline shaft 35 being driven in the vertical direction by the moving device 22 of the mounting head 5. The parallelism adjusting mechanism 37, connecting an upper plate 37a to a lower plate 37b via a center connection rod 37c, contacts the bottom ends of three adjuster screws 37d, which are screwed through the upper plate 37a, to the top face of the lower plate 37b to control the slanting of the lower plate 37b by changing the depth of each adjuster screw 37d.

The ultrasonic bonding head 21 includes an ultrasonic vibration generator 24, an oscillator 38, and a supporting bracket 39, with the top end 39a of the supporting bracket 39 being secured to the bottom face of the parallelism adjusting mechanism 37. The oscillator 38 has a block-like shape, and a basal face 40 at its one end is coupled with the ultrasonic vibration generator 24, while a working face 41 is formed at the other end. The oscillator 38 is disposed to slant upward with its working face 41 being held horizontal, and a secured unit 38a, which is formed in the position corresponding to a node of the oscillation mode of the oscillator 38, is secured to the supporting bracket 39. Preferably, the oscillator 38 has a shape that makes the ultrasonic vibration provided to the basal face 40 vibrate in the working face 41 approximately in parallel thereto. However, this vibration needs not to be parallel to the working face; instead, the direction of vibration may slant by about 5–35°.

The supporting bracket 39 has a positioning hole 39b in the center of its topside to share the axial line with the spline shaft 35, while the bracket 39 has in its lower part a groove 45 where the oscillator 38 is to be inserted and a pair of opposed plates 46 on its sides. A cartridge heater 47 working as the heater is buried in a lower part of each of the opposed plates 46 to face the end of the oscillator 38. This heater 47 heats up the lower part of each of the plates 46, and the vicinity of the working face 41 of the oscillator 38 is heated by radiant heat. Because the heater is disposed off the oscillator 38, the ultrasonic vibration system is not affected by the heater.

A cooling chamber 43 working as a cooling unit or a temperature retaining unit is provided so as to surround the connection rod 42 that connects the ultrasonic vibration generator 24 with the oscillator 38. By introducing cooling air from an inlet 43a and discharging from an outlet 43b, the connection rod 42 and the ultrasonic vibration generator 24 are cooled, dissipating heat coming from the heated oscillator 38, and thereby to prevent a temperature rise in the ultrasonic vibration generator 24 to avoid performance failure and damage. By embedding a thermocouple 44 working as a temperature monitoring member in the connection rod 42, bonding failure and degradation of the ultrasonic vibration performance due to temperature rise are prevented.

Figure 7:
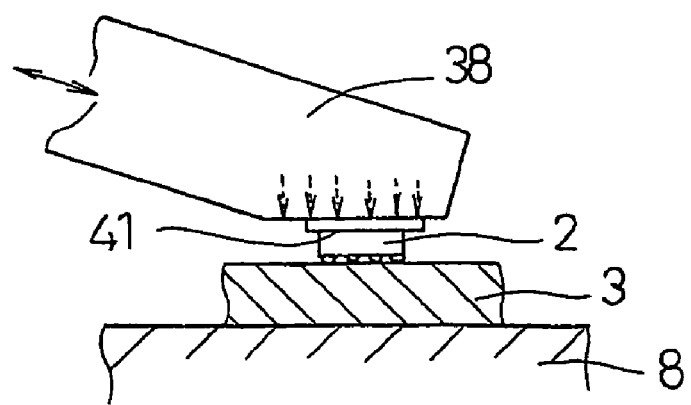
FIG. 7 is a view illustrating the bonding configuration according to the embodiment.

In the above configuration, as shown in FIG. 7, the substrate 3 is mounted on the supporting base 8, and the component 2 that will be bonded is mounted thereon. Otherwise, with the component 2 being held with a suction device (not shown) installed in the oscillator 38, the spline shaft 35 is lowered to move the ultrasonic bonding head 21 downward to the supporting base 8. The working face 41 of the oscillator 38 and the top face of the supporting base 8 sandwich the component 2 and the substrate 3, while a prescribed pressure load is applied to the supporting bracket 39. Under this condition, the ultrasonic vibration generator 24 provides ultrasonic vibration to the basal face 40 of the oscillator 38, and the cartridge heater 47 is activated for heating.

The working face 41 kept parallel to the bonding face ultrasonic-vibrates, and the supporting bracket 39 applies a pressure load onto the oscillator 38. The cartridge heater 47 heats the lower part of the opposed plates 46, and the heat irradiated therefrom heats the vicinity of the working face 41. The heat is conveyed to the component 2 as shown with a broken line in the figure, and then thermal energy is provided to the bonding face between the substrate 3 and the component 2.

In this manner, with the parallelism between the working face 41 and the bonding face between the component 2 and the substrate 3 being maintained and the pressure load being applied, ultrasonic vibration is applied to provide ultrasonic energy and at the same time thermal energy is also provided. Then the entire bonding face is bonded with high reliability even if the bonding area is large. If a seal material is put in advance between the substrate 3 and the component 2, the seal material is cured at the same time as bonding. There is no need to prepare a separate seal-filling/curing process, thereby reducing the manufacturing cost.

Since the cartridge heater 47 installed in the opposed plates 46 (facing both sides of the oscillator 38) irradiates heat onto the oscillator 38, the ultrasonic vibration system is not affected. In addition, the use of the cartridge heater 47 leads to an inexpensive, low-cost system.

Since the ultrasonic vibration generator 24 is cooled by the cooling chamber 43, the heat of the cartridge heater 47 does not reach the ultrasonic vibration generator 24, and its performance failure and damage is prevented. Furthermore, because a temperature monitor member such as the thermocouple 44 is installed in the connection rod 42 disposed between the ultrasonic vibration generator 24 and the oscillator 38, high temperatures do not reach the ultrasonic vibration generator 24. Thus, it is possible to prevent its performance failure and bonding failure.

Although the cartridge heater 47 buried in the opposed plates 46 was exemplified, the heater of the invention is not limited to this type.

Figure 8A:
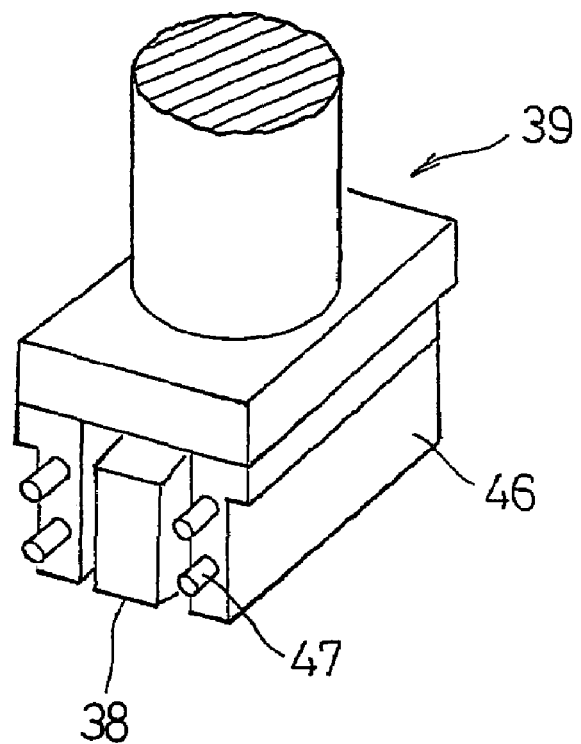
FIG. 8A is a perspective view showing a first variation of the heater according to the embodiment.
Figure 8B:
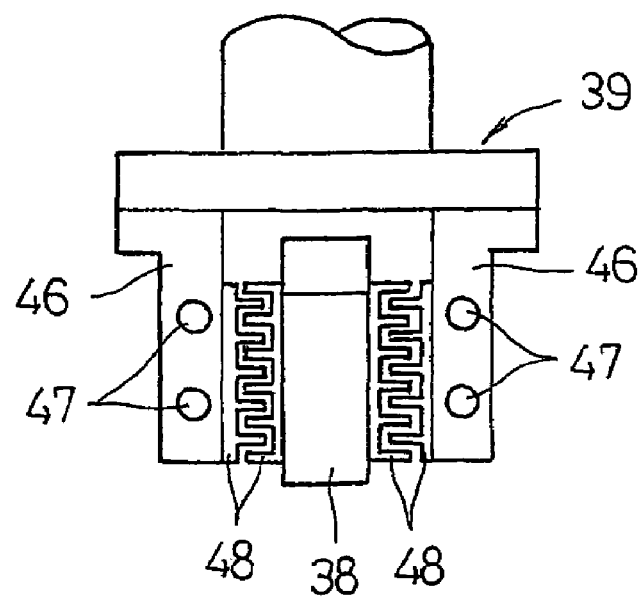
FIG. 8B is a side view of its improved example.

For example, like a first variation shown in FIG. 8A, at least one of the pair of opposed plates 46 may be detachably attached to the supporting bracket 39, and the cartridge heater 47 may be buried in this plate 46. As shown in FIG. 8B, a heat conduction fin 48 is preferably installed on at least either of the opposed faces between the oscillator 38 and the plate 46 to increase the heat conduction by radiation from the opposed plate 46 to the oscillator 38.

Figure 9A:
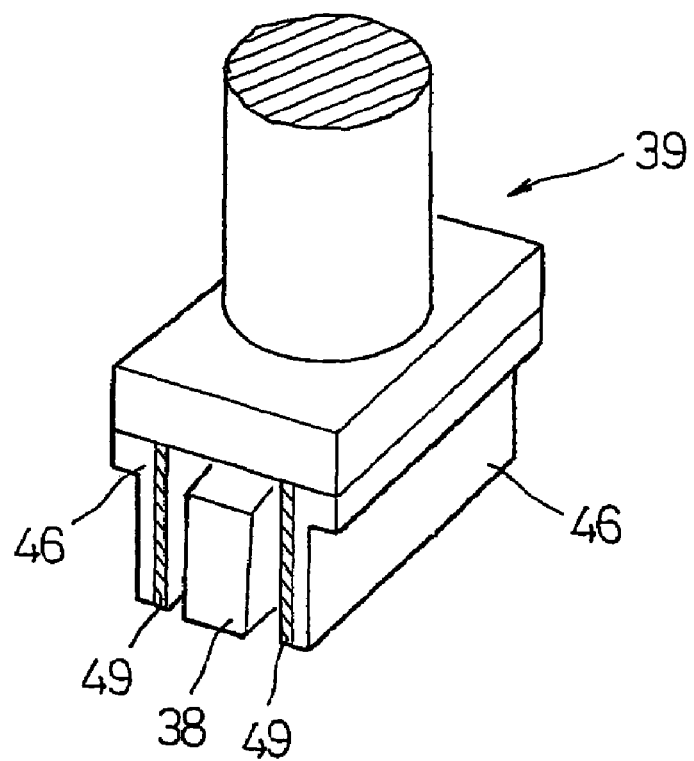
FIG. 9A is a perspective view showing a second variation of the heater according to the embodiment.
Figure 9B:
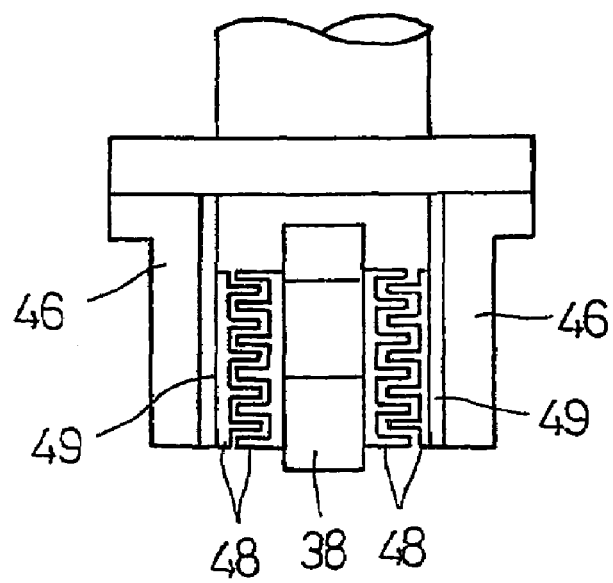
FIG. 9B is a side view of its improved example.

Otherwise, like a second variation shown in FIG. 9A, a plate-like ceramic heater 49, instead of the cartridge heater 47, can be installed on the face of the opposed plate 46 to face the oscillator 38. Then the target area is uniformly heated. Meanwhile, as shown in FIG. 9B, if a heat conduction fin 48 is installed on at least either of the opposed faces between the oscillator 38 and the ceramic heater 49, heat conduction by radiation is enhanced.

Figure 10A:
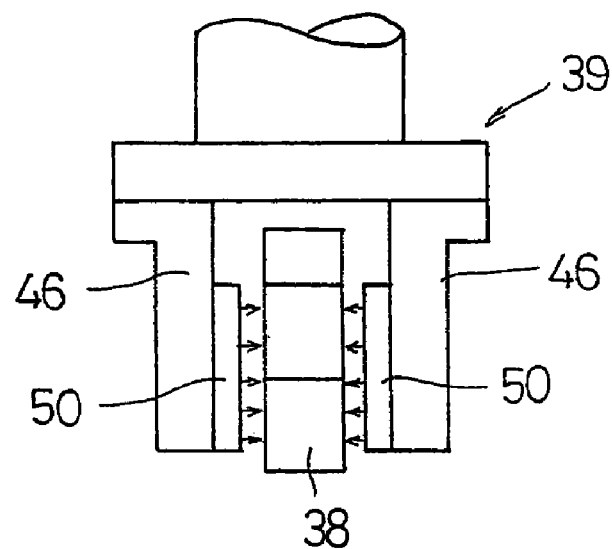
FIG. 10A is a perspective view showing a third variation of the heater according to the embodiment.
Figure 10B:
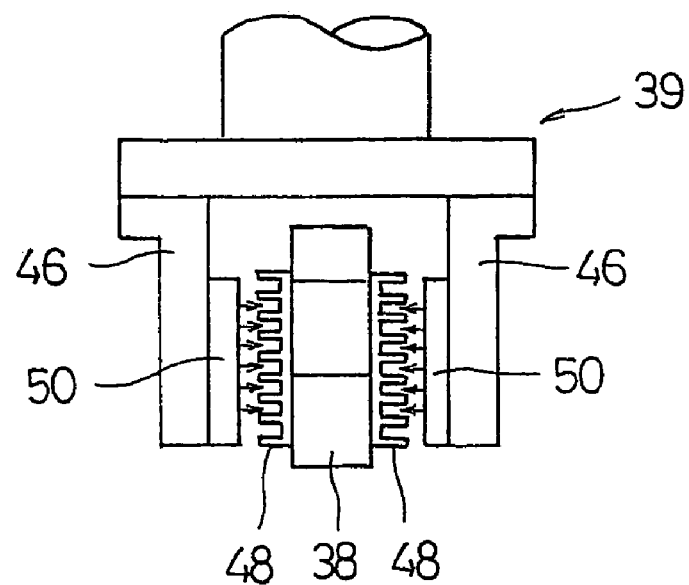
FIG. 10B is a side view of its improved example.

As shown in a third variation of FIG. 10A, a hot-air blower 50, instead of the cartridge heater 47 and the ceramic heater 49, can be installed on the face of the opposed plate 46 to face the oscillator 38. Since hot air directly contacts the oscillator 38, a rapid, uniform heating is achieved. As shown in FIG. 10B, if a heat conduction fin 48 is installed on both sides of the oscillator 38, the heat exchange with the blown out hot air is enhanced, and whereby the heat conduction to the oscillator 38 is raised.

Figure 11:
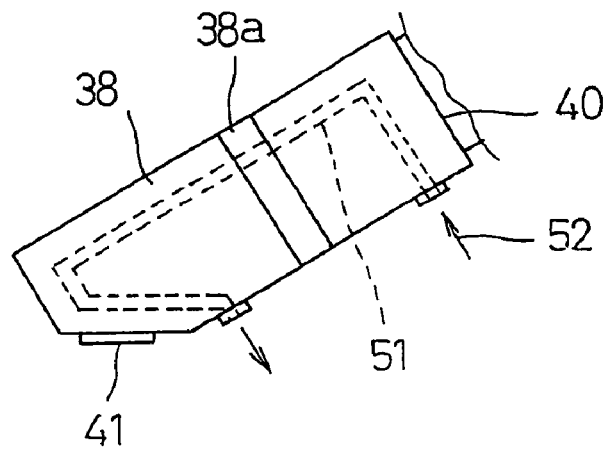
FIG. 11 is a front view showing the oscillator of a fourth variation of the heater according to the embodiment.

Meanwhile, as shown in a fourth variation of FIG. 11, if a heating medium pathway 51 is formed in the oscillator 38 and a heating medium such as hot air is supplied to this pathway 51, as shown with the arrow, using a heating medium feeder 52, the oscillator 38 is heated directly from its inside. Then the target area is further efficiently heated up. The heating medium feeder 52 is preferably disposed near the working face 41.

Figure 12:
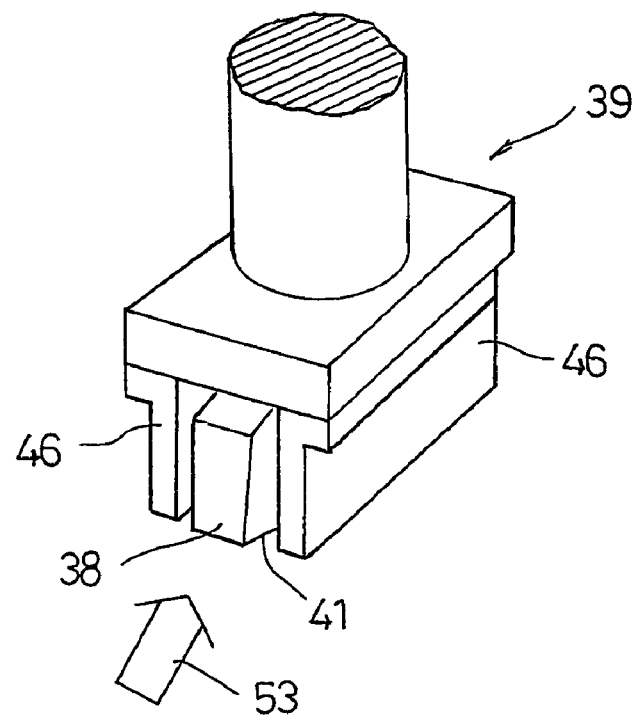
FIG. 12 is a perspective view showing a fifth variation of the heater according to the embodiment.

As shown in a fifth variation of FIG. 12, a heat ray emitter 53 (indicated with a hollow arrow) that emits heat rays such as laser light to the vicinity of the working face 41 of the oscillator 38 can be installed. The vicinity of the working face 41 is efficiently heated in a non-contact manner. Instead of the heat ray emitter 53, if means for emitting electromagnetic waves to the vicinity of the working face 41 is disposed and the oscillator 38 is formed by a ferromagnetic material, the vicinity of the working face 41 is heated by electromagnetic induction.

(Fourth Embodiment)

Now a fourth embodiment of the component mounting method and apparatus of the invention will be described with reference to FIGS. 13–21.

Figure 13:
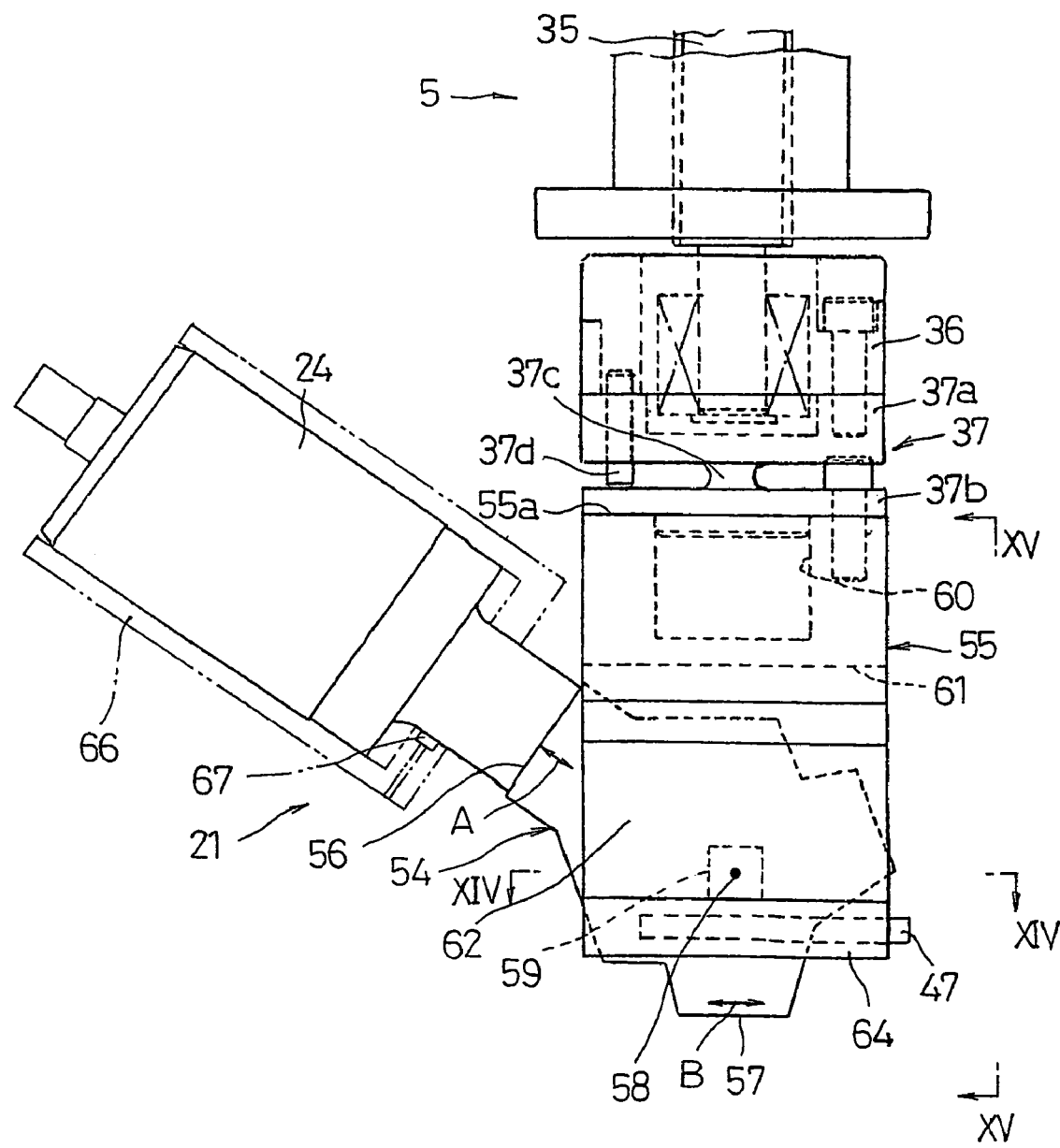
FIG. 13 is a front view showing the essential part of a mounting head according to a fourth embodiment of the invention.

The essential part of the mounting head 5 of the embodiment is described with reference to FIGS. 13–16. In FIG. 13, the ultrasonic bonding head 21 includes an ultrasonic vibration generator 24, an oscillator 54, and a supporting bracket 55. Referring to FIG. 16, the oscillator 54 has a Y-shaped unit having a base unit 54a and a pair of branches 54b as well as a projection 54c on both sides of the base unit 54a, while the ultrasonic vibration generator 24 is connected to a basal face 56 of the base unit 54a. The oscillator 54 and the ultrasonic vibration generator 24 are secured to the supporting bracket 55 in an upwardly slanting attitude, so that the end face of one branch 54b lies horizontal and works as a working face 57.

As shown in FIG. 13 and FIG. 16, the shape of the oscillator 54 is designed so that the working face 57 ultrasonic-vibrates in the horizontal direction as shown by arrow B and so that a node 58 of the oscillation mode appears above the working face 57 on its vertical axial line, when the ultrasonic vibration generator 24 applies ultrasonic vibration of vertical vibration mode of a prescribed frequency to the basal face 56 as shown by arrow A. The oscillator 54 has prism-like loading units 59 projecting from both sides thereof at the position corresponding to the node 58, and these loading units 59 are connected to the supporting bracket 55.

Figure 14:
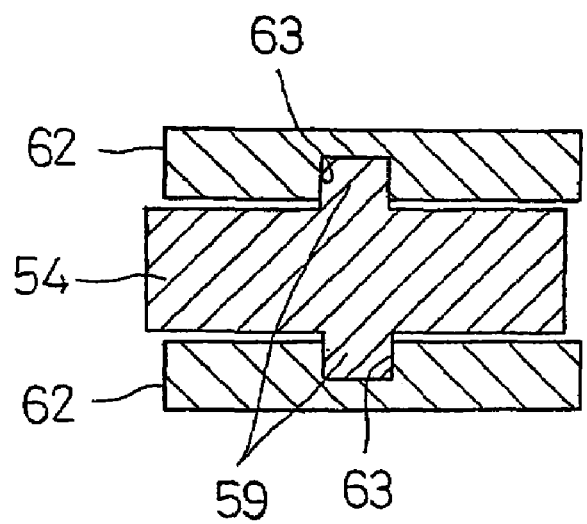
FIG. 14 is a sectional view taken along the line XIV—XIV in FIG. 13.
Figure 15:
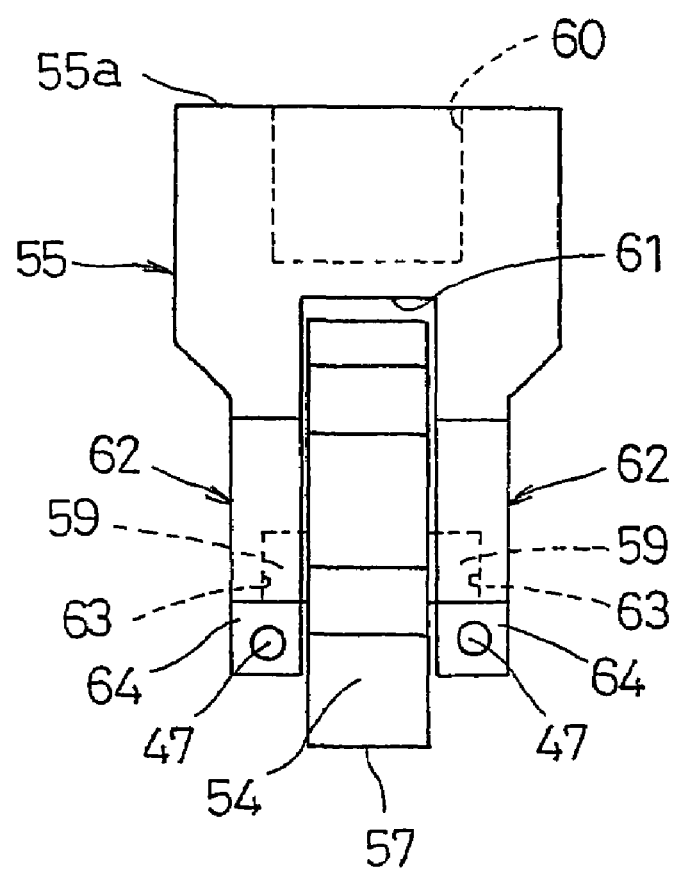
FIG. 15 is a sectional view across the XV—XV line in FIG. 13.
Figure 16:
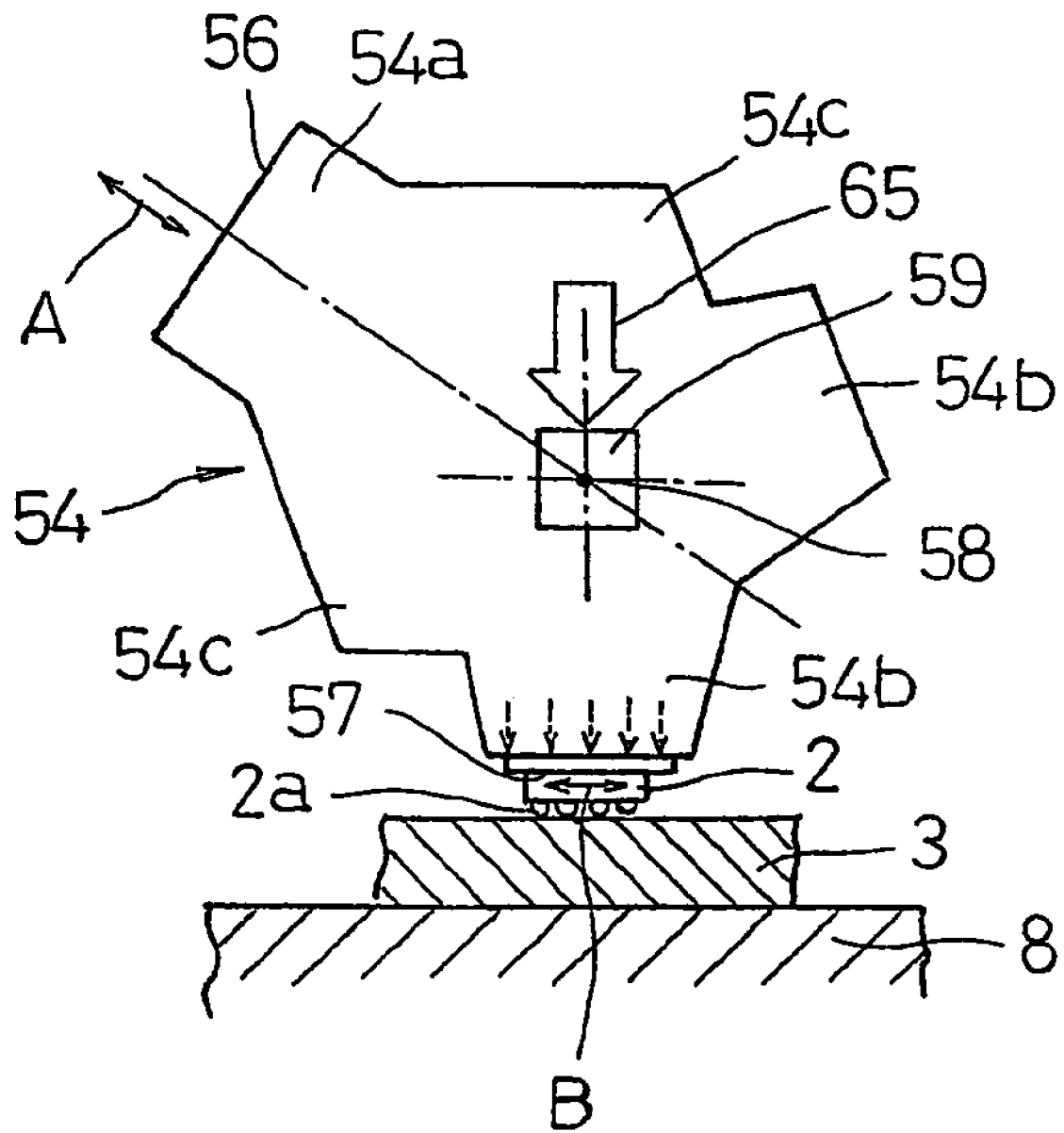
FIG. 16 is a view illustrating the operation of the oscillator according to the embodiment.

As shown in FIGS. 13–15, the supporting bracket 55 has a positioning hole 60 formed in the top center concentrically with the spline shaft 35, a groove 61 where the oscillator 54 is inserted in the lower part, and a pair of supporting plates 62 on the sides of the groove 61. Each of the supporting plates 62 has in its bottom center a square notch 63, with the loading unit 59 being inserted thereto from the bottom side. A cartridge heater 47 is embedded in a lid 64 fixed on the underside of each supporting plate 62, heating the lower part of the plate 62. The heat radiated therefrom in turn heats the vicinity of the working face 57 of the oscillator 54.

In the above structure shown in FIG. 16, the substrate 3 is put on the supporting base 8. With the component 2 being held with a suction device (not shown) carried on the oscillator 54 of the ultrasonic bonding head 21, the spline shaft 35 is lowered to move the ultrasonic bonding head 21 downward to the supporting base 8. The working face 57 of the oscillator 54 and the top face of the supporting base 8 sandwich the substrate 3 and the component 2, and a prescribed pressure load is provided to the supporting bracket 55 via the spline shaft 35. Under this condition, the ultrasonic vibration generator 24 provides ultrasonic vibration to the basal face 56 of the oscillator 54, and the cartridge heater 47 is activated for heating.

Then the working face 57 of the oscillator 54 ultrasonic-vibrates substantially in parallel thereto, and a pressure load 65 is applied from the supporting bracket 55 to the loading units 59 positioned each at the node 58 of the oscillation mode of the oscillator 54, as shown by the hollow arrow. Since the loading units 59 are disposed immediately above the working face 57, the pressure load works 100% normal to the working face 57. The lower part of each supporting plate 62 is heated by the cartridge heater 47, and the radiant heat heats the vicinity of the working face 57. As the broken lines indicate, such heat reaches the component 2, and thermal energy is thereby provided to the bonding face between the bump electrodes 2a of the component 2 and the leads of the substrate 3.

In this manner, a large ultrasonic energy is provided by ultrasonic vibration, with the parallelism between the working face 57 and the bonding face of the component 2 and the substrate 3 being well maintained and a large pressure load being applied thereto, while thermal energy is provided together. In a case where the component 2 has a number of bump electrodes 2a, and thus, the bonding area is large, all the bump electrodes 2a are bonded with the leads of the substrate 3 with high reliability. At the same time, the seal material applied to the substrate 3 where the component 2 will be mounted and filled in the space between the component 2 and the substrate 3 upon mounting the component 2 is cured by thermal energy. Mounting and sealing of the component 2 is thereby completed at a time.

Since the employed heater is a cartridge heater 47 embedded in the supporting plates 62 and the produced heat is irradiated onto the oscillator 54, the ultrasonic vibration system is not affected by the heater, and the use of a cartridge heater 47 leads to an inexpensive, low-cost system.

Furthermore, as is the case with the third embodiment, a cooling unit 66 that cools the ultrasonic vibration generator 24 or a temperature retaining unit is preferably installed as shown with imaginary lines in FIG. 13, and in addition a temperature monitor member 67 may be installed in the ultrasonic vibration generator 24 or its vicinity, in order to prevent the ultrasonic vibration generator 24 from being exposed to high temperatures due to heating of the oscillator 54 by the cartridge heater 47. As the cooling unit 66, such a unit is preferable that blows cool air to the vicinity of the ultrasonic vibration generator 24 because it is less likely to affect the vibration system. With respect to the temperature monitor member 67, a thermocouple is preferably installed in a position that does not affect the vibration system.

Because the cooling unit 66 prevents overheat of the ultrasonic vibration generator 24, bonding failure is prevented accordingly. In addition, if the temperature monitor member 67 is installed, bonding failure due to degradation of ultrasonic vibration performance is prevented.

As the heater, an example where the cartridge heater 47 is embedded in the lid 64 fixed to the supporting plates 62 of the supporting bracket 55 was demonstrated. However, the present invention is not limited to the exemplified heater, but the same variations as those shown in FIGS. 8A–12 for the third embodiment are also applicable.

Figure 17A:
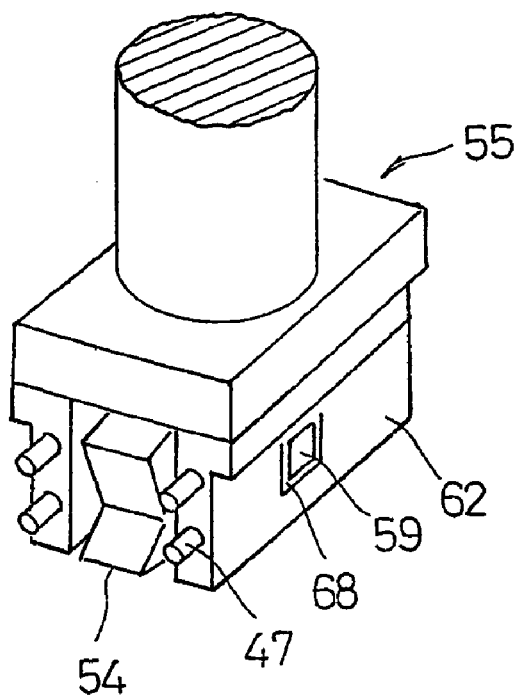
FIG. 17A is a perspective view showing a first variation of the heater according to the embodiment.
Figure 17B:
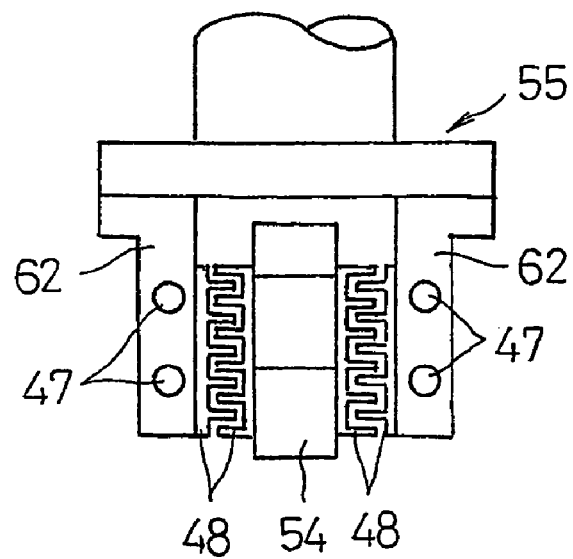
FIG. 17B is a side view of its improved example.

For example, like a first variation shown in FIG. 17A, one of the supporting plates 62 can be detachably attached to the supporting bracket 55, and the loading units 59 projecting from both sides of the oscillator 54 can be fit in the supporting holes formed in the supporting plates 62 via a thermal insulator 68, while embedding the cartridge heater 47 in each supporting plate 62. Meanwhile, as shown in FIG. 17B, by installing a heat conduction fin 48 on at least either side face of the oscillator 54 or the face of the supporting plate 62 facing the oscillator, the heat conduction by radiation from the supporting plate 62 to the oscillator 54 is enhanced.

Figure 18A:
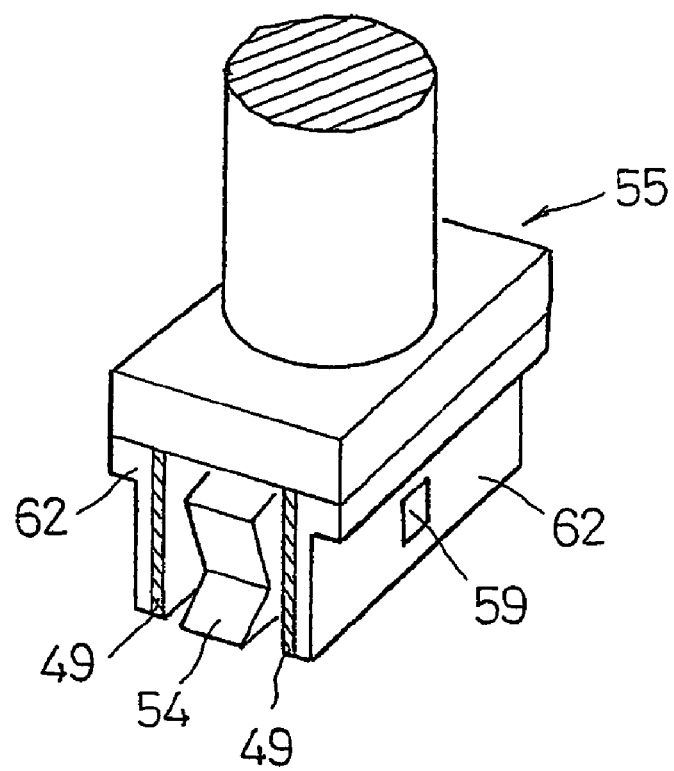
FIG. 18A is a perspective view showing a second variation of the heater according to the embodiment.
Figure 18B:
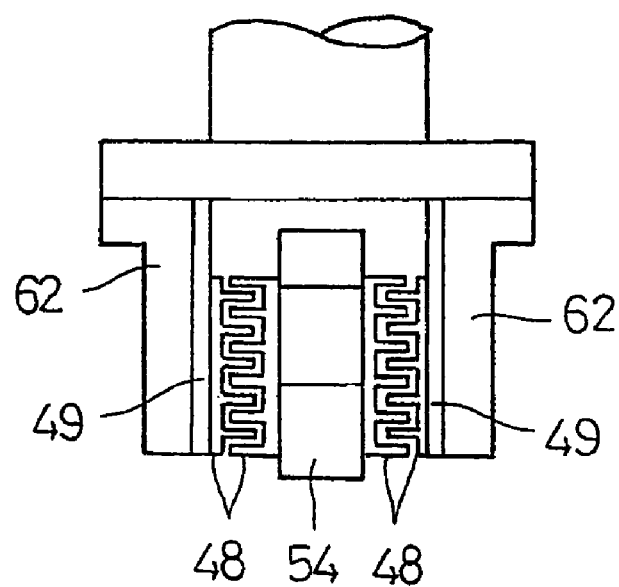
FIG. 18B is a side view of its improved example.

As is the case with a second variation shown in FIG. 18A, a plate-like ceramic heater 49, instead of the cartridge heater 47, can be installed on the face of the supporting plate 62 to face the oscillator 54. Then the target area is uniformly heated. As shown in FIG. 18B, by installing a heat conduction fin 48 on at least either the side face of the oscillator 54 or the face of the ceramic heater 49 facing the oscillator, the heat conduction by radiation from the ceramic heaters 49 to the oscillator 54 is enhanced.

Figure 19A:
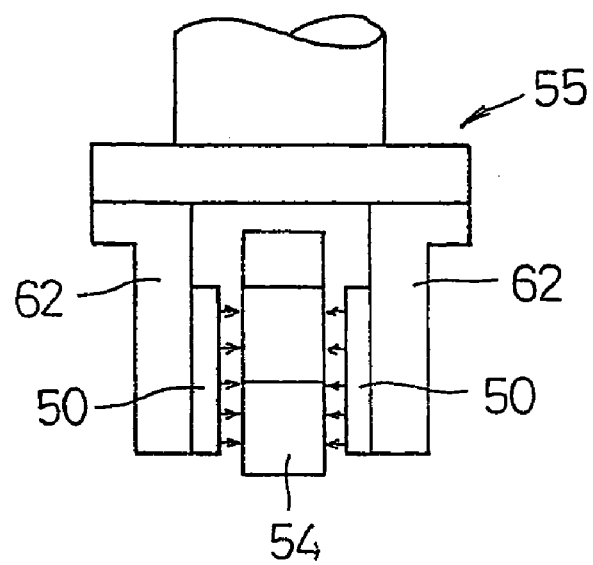
FIG. 19A is a side view showing a third variation of the heater according to the embodiment.
Figure 19B:
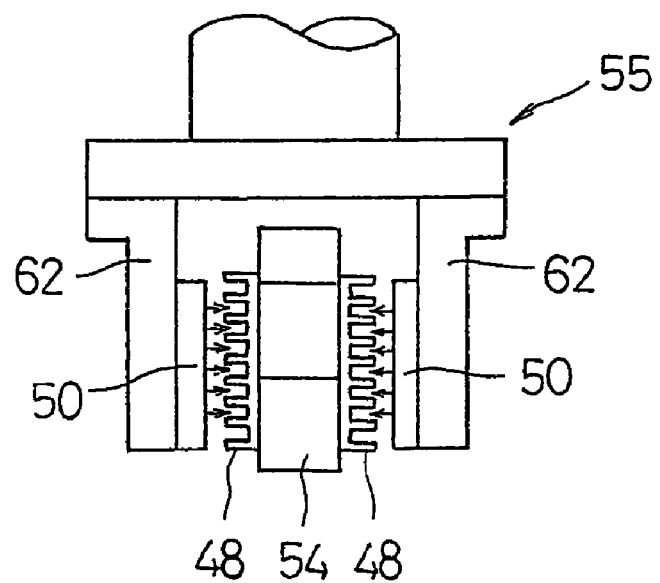
FIG. 19B is a side view of its improved example.

Otherwise, like a third variation shown in FIG. 19A, instead of the cartridge heater 47 and the ceramic heater 49, a hot air blower 50 can be installed on the face of the supporting plate 62 to face the oscillator 54. Since hot air contacts the oscillator 54, a rapid, uniform heating is achieved. Moreover, as shown in FIG. 19B, by installing a heat conduction fin 48 on both sides of the oscillator 54, the heat exchange with the blown out hot air is enhanced, whereby the heat conduction to the oscillator 54 is raised.

Figure 20:
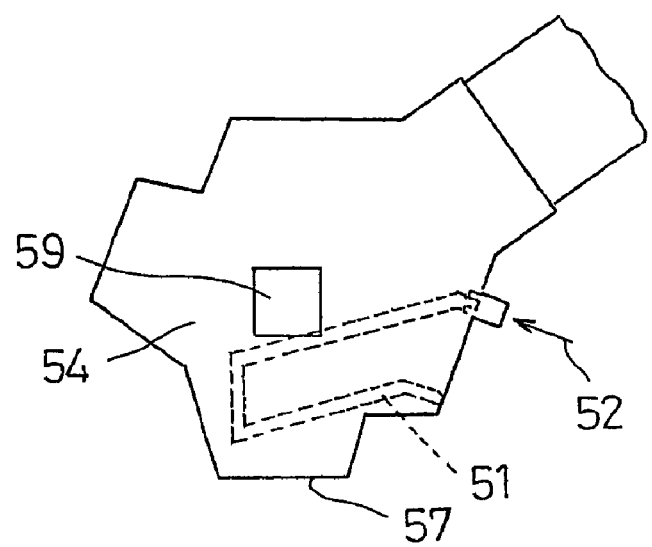
FIG. 20 is a front view showing an oscillator of a fourth variation of the heater according to the embodiment.

Like a fourth variation shown in FIG. 20, by forming a heating medium pathway 51 in the oscillator 54 and by feeding a heating medium such as hot air to this pathway 51, as shown with the arrow, using the heating medium feeder 52, the oscillator 54 is heated directly from the inside. Then, the target area is further efficiently heated up. The heating medium feeder 52 is preferably disposed near the working face 57.

Figure 21:
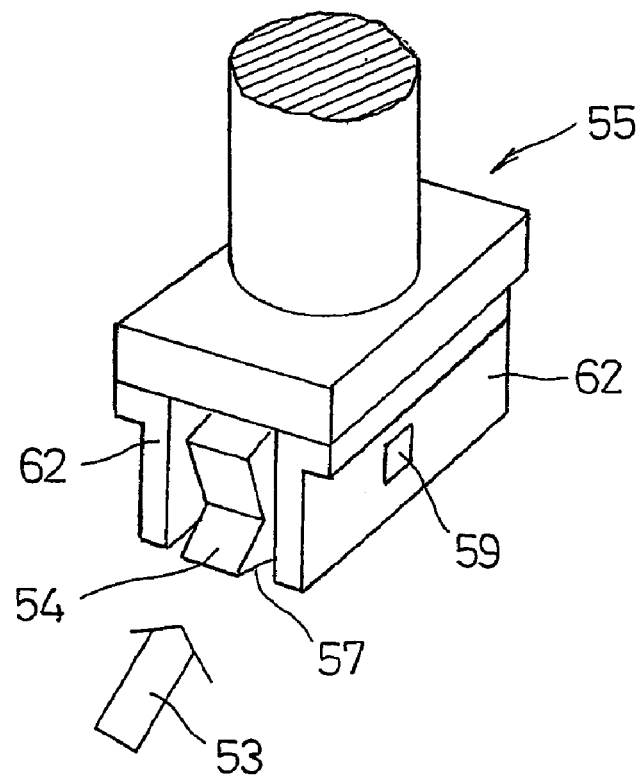
FIG. 21 is a perspective view showing a fifth variation of the heater according to the embodiment.

As shown in a fifth variation of FIG. 21, a heat ray emitter 53 (shown with a hollow arrow) that emits heat rays such as laser to the vicinity of the working face 57 of the oscillator 54 can be installed. The vicinity of the working face 57 is heated up efficiently in a non-contact manner. Instead of such a heat ray emitter 53, if means for emitting electromagnetic waves to the vicinity of the working face 57 is disposed and the oscillator 54 is made of a ferromagnetic material, the vicinity of the working face 57 is heated by electromagnetic induction.

In the ultrasonic bonding head 21 of the above embodiments, the oscillator 38, 54 is unitary. However, in order to provide the best working face 41, 57 corresponding to the shape and dimensions of the component 2 to be mounted, the entire ultrasonic bonding head 21 must be exchanged when the specs of the component 2 have been changed. Since the ultrasonic bonding head 21 is expensive, the machine cost will be high if a number of ultrasonic bonding heads 21 are prepared to meet the specs of each component 2. Thus, as shown in FIG. 22, it is preferable to constitute the vicinity of the working face 41, 57 of the oscillator 38, 54 with a detachable separate piece 41a, 57a.

Figure 22:
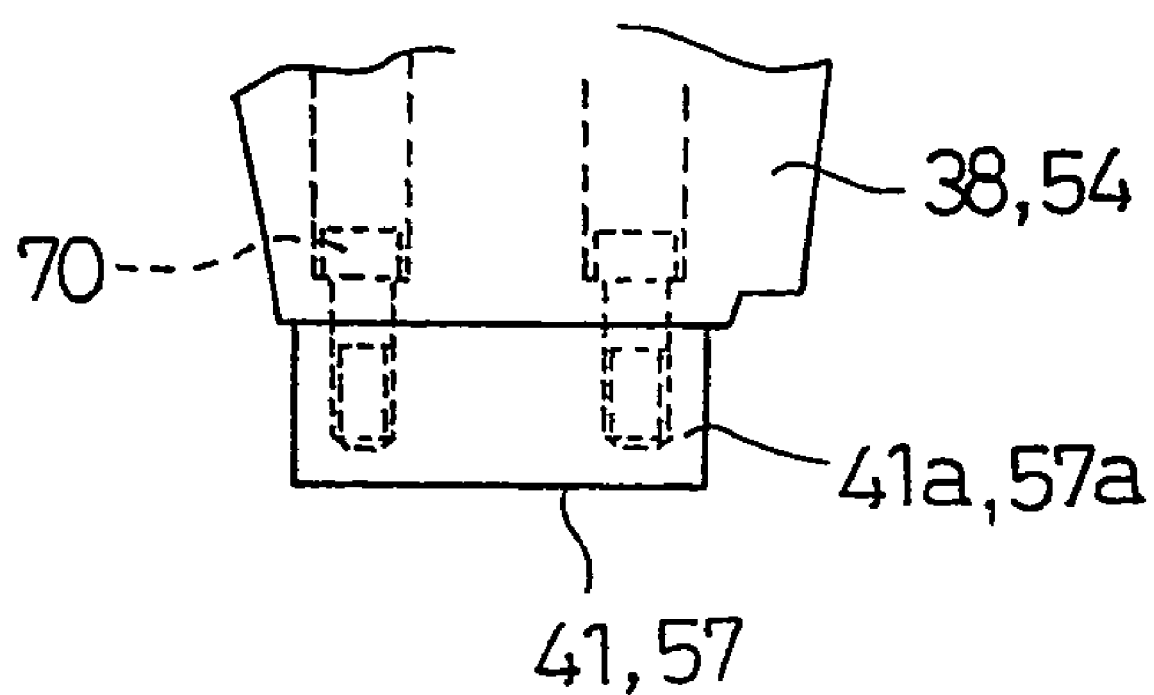
FIG. 22 is a front view showing the essential part of a variation of the oscillator.

Such a separate piece 41a, 57a can be detachably secured to the oscillator 38, 54 with bolts 70, as shown in FIG. 22. If a plurality of bolts 70 are used to secure the separate piece, the contact area, and the contact strength with the oscillator 38, 54 are enlarged, whereby the ultrasonic propagation efficiency is increased. Although FIG. 22 shows an example where the contact face between the separate piece and the oscillator is parallel to the ultrasonic vibration, it is further preferable to prepare a contact face normal to the direction of vibration and secure the separate piece with more than one face. Instead of such fastener bolts, pressure bolts, combination of pressure bolts and slanting faces for fitting, or a wedge can be used together to secure the separate piece.

Although the above embodiments described examples where the component 2 having a plurality of bump electrodes 2a is mounted onto the substrate 3, the present invention is not limited to such examples. For instance, the invention is useful when mounting an arbitrary component onto a mounting object, or when bonding various components to an arbitrary object by ultrasonic vibration using an ultrasonic bonding head.

INDUSTRIAL APPLICABILITY

According to the component mounting method and the component mounting apparatus of the invention, the bump electrode ends of the electronic component are held precisely parallel to the bonding face of the mounting object even when a large pressure load is applied to the rear face of the electronic component. The invention is therefore useful in bonding an electronic component which has many bump electrodes, and thus, the bonding area is large.

The invention claimed is:

1. A component mounting method for mounting a component having a plurality of bump electrodes on one face thereof onto leads of a mounting object, comprising:
holding with a mounting head a rear face of the component, the rear face being opposite to the face having the bump electrodes;
aligning the component with the mounting object disposed on a supporting base, and contacting the individual bump electrodes of the component to the individual leads of the mounting object; and applying a pressure load and thermal energy to the rear face of the component while providing ultrasonic vibration, a vibrating direction of which is substantially parallel to the rear face, the thermal energy being applied to the rear face of the component by a heater provided in the mounting head; and wherein the rear face of the component is held by a working face of an oscillator that is configured such that vibration provided to an end face thereof causes vibration substantially parallel to the working face and such that a node of an oscillation mode is formed on an axis perpendicular to the working face;

wherein the oscillator forms part of the mounting head; and wherein the pressure load is applied to the node of the oscillator.

2. The component mounting method according to claim 1, wherein the pressure load is applied to the rear face of the component from a position immediately thereabove in a direction perpendicular thereto.

3. A component mounting method according to claim 1 or 2, wherein an element of the ultrasonic vibration perpendicular to the rear face of the component is less than 10% of an element of the ultrasonic vibration parallel to the rear face.

4. A component mounting method according to claim 1 or 2, wherein the pressure load is a product of the number of the bump electrodes and a unit load in a range of 30–200 g per bump electrode of the component.

5. A component mounting method according to claim 1 or 2, wherein the component has 50 or more bump electrodes.

6. A component mounting method for mourning a component having a plurality of bump electrodes on one face thereof onto leads of a mounting object, comprising:

holding with a mounting head a rear face of the component, the rear face being opposite to the face having the bump electrodes;

aligning the component with the mounting object disposed on a supporting base, and contacting the individual bump electrodes of the component to the individual leads of the mounting object; and applying a pressure load and thermal energy to the rear face of the component while providing ultrasonic vibration, a vibrating direction of which is substantially parallel to the rear face, the thermal energy being applied to the rear face of the component by a heater provided in the mounting head;

wherein an element of the ultrasonic vibration perpendicular to the rear face of the component is less than 10% of an element of the ultrasonic vibration parallel to the rear face.

7. A component mounting method for mounting a component having a plurality of bump electrodes on one face thereof onto leads of a mounting object, comprising:

holding with a mounting head a rear face of the component, the rear face being opposite to the face having the bump electrodes;

aligning the component with the mounting object disposed on a supporting base, and contacting the individual bump electrodes of the component to the individual leads of the mounting object; and applying a pressure load and thermal energy to the rear face of the component while providing ultrasonic vibration, a vibrating direction of which is substantially parallel to the rear face, the thermal energy being applied to the rear face of the component by a heater provided in the mounting head;

wherein the pressure load is a product of the number of the bump electrodes and a unit load in a range of 30–200 g per bump electrode of the component.

\* \* \* \* \*